United States Patent [19]
Kawai

[11] Patent Number: 5,477,083
[45] Date of Patent: Dec. 19, 1995

[54] CHIP CARRIER FOR ENABLING PRODUCTION OF HIGH PERFORMANCE MICROWAVE SEMICONDUCTOR DEVICE BY DISPOSING SEMICONDUCTOR CHIP THEREON

[75] Inventor: Takahisa Kawai, Kawasaki, Japan

[73] Assignee: Fujitsu Limited, Kawasaki, Japan

[21] Appl. No.: 683,048

[22] Filed: Apr. 10, 1991

[30] Foreign Application Priority Data

Apr. 16, 1990 [JP] Japan ........................................ 2-99896

[51] Int. Cl.$^6$ .............................. H01L 23/02; H01L 23/12
[52] U.S. Cl. ........................... 257/701; 257/664; 257/690; 257/702; 257/704; 333/247
[58] Field of Search ....................... 357/70, 74; 330/306; 257/664, 701, 690, 702, 704; 333/247

[56] References Cited

U.S. PATENT DOCUMENTS

| | | | |
|---|---|---|---|
| 3,946,428 | 3/1976 | Anazawa et al. | 357/74 |
| 4,037,168 | 7/1977 | Katoh et al. | 330/31 |
| 4,098,452 | 7/1978 | Webster et al. | 228/123 |
| 4,259,684 | 3/1981 | Dean et al. | 357/74 |
| 4,546,478 | 10/1985 | Shimizu et al. | 372/36 |
| 4,992,851 | 2/1991 | Platzoeder et al. | 357/74 |
| 5,010,304 | 4/1991 | Mueller et al. | 330/269 |
| 5,014,115 | 5/1991 | Moser | 357/74 |
| 5,021,759 | 6/1991 | Gamand et al. | 333/246 |
| 5,023,703 | 6/1991 | Hidaka et al. | 357/74 |
| 5,027,191 | 6/1991 | Bourdelaise et al. | 357/74 |

FOREIGN PATENT DOCUMENTS

| | | |
|---|---|---|
| 0034001 | 8/1981 | European Pat. Off. . |
| 2244264 | 4/1975 | France . |
| 2324164 | 4/1977 | France . |

OTHER PUBLICATIONS

Patent Abstracts of Japan, vol. 7, No. 229 (E–203)(1374) Oct. 12, 1983 and JP–A–58 119 665 (Hitachi Seisakucho K.K.).

*Primary Examiner*—Rolf Hille
*Assistant Examiner*—David Ostrowski
*Attorney, Agent, or Firm*—Staas & Halsey

[57] ABSTRACT

A chip carrier for a semiconductor chip, the chip having a specified thickness and lateral configuration and size. A conductive holder of the carrier has a main surface including a chip mounting surface portion for mounting the semiconductor chip thereon and a peripheral surface portion surrounding the mounting surface portion. An insulative collar member is affixed to the peripheral surface portion and has inner wall surfaces surrounding the mounting surface portion and defining a recess, of depth and lateral configuration and size dimensions respectively corresponding to those of the chip, for receiving therein and thereby positioning the chip on the conductive holder. A semiconductor chip of low mechanical strength therefore is converted for handling purposes to handling of the chip carrier, which has a high mechanical strength and facilitates easy and precise mounting of the chip on a predetermined position of a package, and which permits replacement of a defective chip without discarding the associated package.

33 Claims, 11 Drawing Sheets

CHIP CARRIER FOR ENABLING PRODUCTION OF HIGH PERFORMANCE MICROWAVE SEMICONDUCTOR DEVICE BY DISPOSING SEMICONDUCTOR CHIP THEREON

BACKGROUND OF THE INVITATION

1. Field of the Invention

The present invention relates to a chip carrier and, more particularly, to a chip carrier disposed in a package of a microwave semiconductor device for mounting a microwave semiconductor chip thereon. Furthermore, the present invention also relates to a high-power microwave semiconductor device using the chip carrier and a method of producing the microwave semiconductor device.

2. Description of the Related Art

Recently, high-power microwave semiconductor devices, which are used, for example, to amplify signals of a microwave band (1–30 GHz) for transfering to a communications satellite, have been studied and produced. Note, the microwave semiconductor device includes a semiconductor chip, an input matching circuit, an output matching circuit, and the like, which are provided in a package. The semiconductor chip comprises a plurality of FETs (Field Effect Transistors) to constitute an amplifier circuit for amplifying input microwave signals. The input matching circuit is used for impedance matching at an input side of the amplifier circuit, and the output matching circuit is used for impedance matching at an output side of the amplifier circuit.

In the high-power microwave semiconductor device according to the related art, the semiconductor chip is positioned between the input matching circuit and the output matching circuit, input side electrodes of the semiconductor chip are connected to electrodes of the input matching circuit by bonding wires, and output side electrodes of the semiconductor chip are connected to electrodes of the output matching circuit by bonding wires. Note, when producing (or assembling) the microwave semiconductor device, the semiconductor chip is directly disposed at a position between the input matching circuit and the output matching circuit in the package, and then, the semiconductor chip is fixed to the surface of the package by heating and melting gold-tin alloy and by carrying out a scrub process (which is a process of scrubbing the semiconductor chip on the surface of the package).

The high-power microwave semiconductor chip is formed thinly to effectively radiate the heat which is caused by itself, because the high-power microwave semiconductor chip consumes a large amount of power and a large amount of heat is produced thereby. Note, the semiconductor chip for a high-power microwave semiconductor device is, for example, made of a compound semiconductor material (GaAs, and the like), which is more delicate than a silicon (Si) semiconductor chip, and may be broken during the scrub process. Furthermore, when electrical characteristics of the semiconductor chip are ascertained to be inferior after fixing the semiconductor chip to the package, it is difficult to remove the semiconductor chip from the package, so that the semiconductor chip and the package which includes the matching circuits, and the like, must be all rejected.

SUMMARY OF THE INVENTION

It is an object of the present invention to provide a chip carrier for enabling the production of a high performance microwave semiconductor device by exactly and easily disposing a microwave semiconductor chip on a package, and by avoiding an impedance mismatch caused by different lengthes of bonding wires. It is another object of the present invention to provide a chip carrier for enabling a conversion from handling of a compound semiconductor chip having a weak mechanical strength to a handling of a chip carrier having a high mechanical strength. Furthermore, it is another object of the present invention to provide a chip carrier for enabling an increase in the yield rate of the microwave semiconductor device by avoiding a creeping up the gold-tin alloy when a scrub process is carried out. In addition, it is still another object of the present invention to provide a microwave semiconductor device for enabling the removal or rejection of only a chip carrier including a semiconductor chip without rejecting associated elements such as a package, matching circuits, and the like.

According to the present invention, there is provided a chip carrier comprising: a conductive holder having a chip mounting portion, for mounting a semiconductor chip on the chip mounting portion; and an insulative collar member having an inner portion whose shape is suitable for an outer shape of the semiconductor chip, provided at the periphery of the conductive holder, for positioning the semiconductor chip.

Further, according to the present invention, there is provided a microwave semiconductor device comprising: a package having an input terminal and an output terminal; a semiconductor chip, including an amplifier circuit for amplifying input microwave signals supplied to the input terminal; an input matching circuit, provided in the package and operatively connected between the input terminal and the semiconductor chip, for carrying out impedance matching at an input side of the amplifier circuit; an output matching circuit, provided in the package and operatively connected between the semiconductor chip and the output terminal, for carrying out impedance matching at an output side of the amplifier circuit; and a chip carrier, provided between the input matching circuit and the output matching circuit in the package, on which the semiconductor chip is affixed thereon.

The input matching circuit and the semiconductor chip may be connected by a plurality of bonding wires, and the semiconductor chip and the output matching circuit may be connected by a plurality of bonding wires. The microwave semiconductor device may further comprise: an input transmission line, inserted between the input terminal and the input matching circuit, for carrying out a fine control of the impedance matching at the input side of the amplifier circuit; and an output transmission line, inserted between the output matching circuit and the output terminal, for carrying out a fine control of the impedance matching at the output side of the amplifier circuit. The input transmission line and the input matching circuit may be connected by a plurality of bonding wires, and the output matching circuit and the output transmission line may be connected by a plurality of bonding wires. The microwave semiconductor device may comprise a plurality of groups, each group comprising the chip carrier having the semiconductor chip fixed thereon, the input matching circuit, and the output matching circuit.

The rear of the semiconductor chip may be specified at a ground level of the semiconductor chip, and the conductive holder may be used to bring out the ground level by mounting the semiconductor chip thereon, or the conductive holder may be used to electrically transfer the ground level to the package by mounting the semiconductor chip thereon. The chip carrier conductive holder may be made of gold-plated copper, and the insulative collar member may be made of ceramic.

The chip mounting portion may be placed at the inner portion of the insulative collar member. A solder portion may be previously provided on the surface of the chip mounting portion to fix the semiconductor chip thereon. The solder portion may be made of a gold-tin alloy.

The space between an outer edge of the semiconductor chip and the inner wall portion of the insulative collar member may be specified at below 100 μm, preferably specified at below 50 μm. The semiconductor chip may be made of compound semiconductor material, e.g., Gallium Arsenide. A bottom portion of the semiconductor chip may be plated with gold. The semiconductor chip may comprise a plurality of field effect transistors connected to constitute an amplifier circuit. The semiconductor chip may be a monolithic microwave integrated circuit chip.

Furthermore, according to the present invention, there is also provided a method of producing a semiconductor device comprising the steps of: disposing a semiconductor chip on a chip carrier including a conductive holder and an insulative collar member, by positioning the semiconductor chip at an inner wall of the insulative collar member provided at the periphery of the conductive holder; heating the chip carrier for melting a solder portion provided on the holder and thereby affixing the semiconductor chip on the conductive holder; mounting the chip carrier at a specific position in a package, and carrying out wire-bonding between electrodes of the semiconductor chip and an input terminal or an output terminal of the package.

The chip carrier heating step may be carried out by using a semiconductor chip fixing apparatus for applying pressure to the chip carrier carrying the semiconductor chip. The semiconductor chip fixing apparatus may comprise an upper tray including a convex portion, and a lower tray including a concave portion for mounting the semiconductor chip carrier therein. The concave portion of the lower tray may include a first concave portion and a second concave portion, the first concave portion may be formed to be suitable for the convex portion of the upper tray, and the second concave portion may be formed to mount the chip carrier carrying the semiconductor chip.

The lower tray may be mounted on a hot plate to heat the chip carrier disposed in the second concave portion to a specific temperature, Further, press boards may be provided at both sides of the convex portion, and a gap between the press boards may be positioned at the portion corresponding to a center portion of the semiconductor chip so that the center portion is not pressed by the press boards.

The upper tray and the lower tray may be made of gold-plated brass, and the press boards may be made of aluminum oxide, The upper tray may include a plurality of convex portions, and the lower tray may include a plurality of concave portions,

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

First, a microwave semiconductor device according to the related art will be explained with reference to FIGS. 1A, 1B, 2A, and 2B.

Figure 1A:
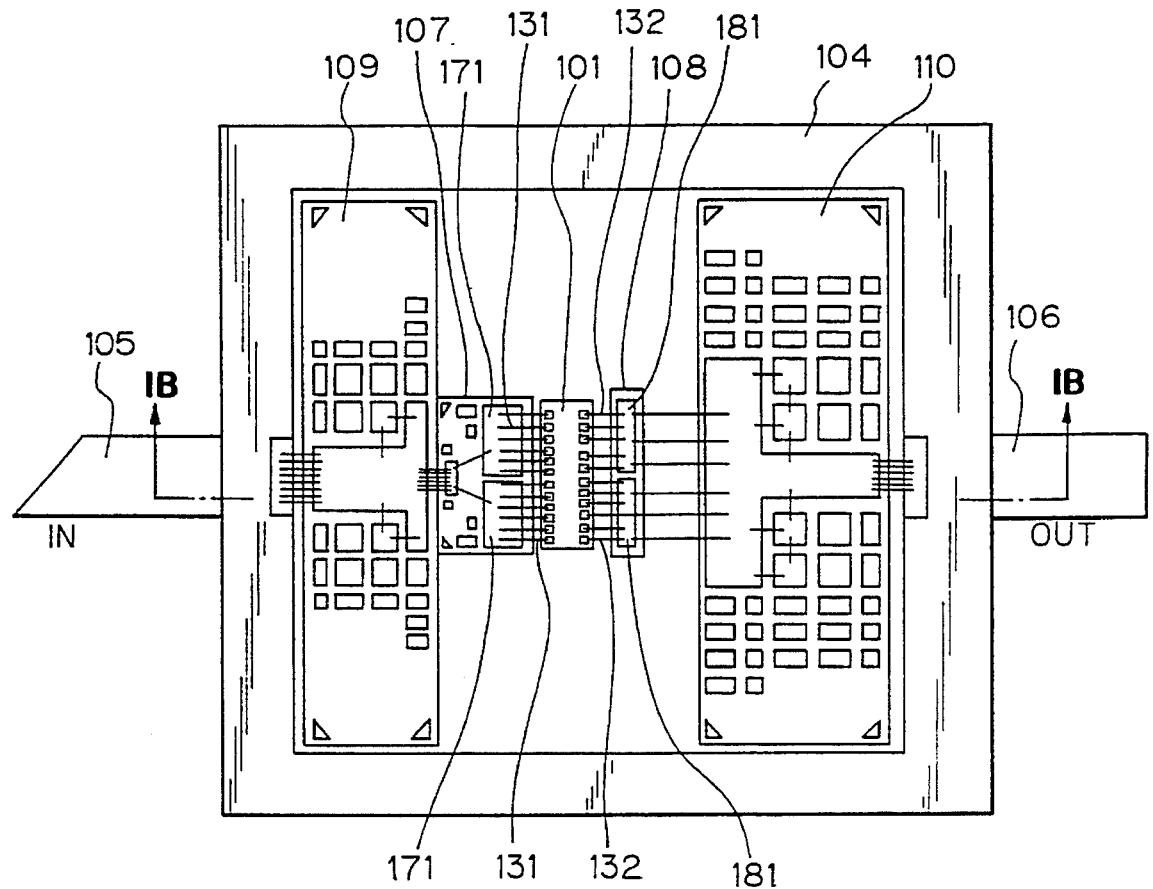
FIGS. 1A and 1B are diagrams indicating an example of a microwave semiconductor device according to the related are.
Figure 1B:
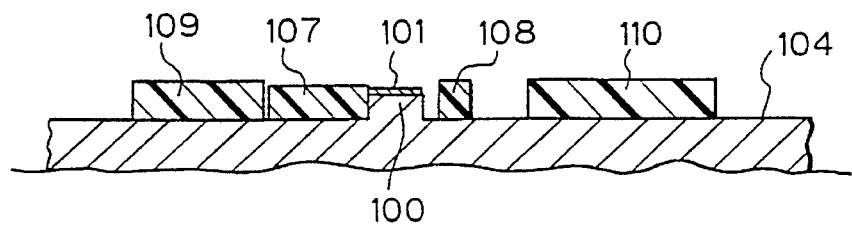

FIG. 1A is a plan diagram indicating an example of a microwave semiconductor device according to the related art, and FIG. 1B is a sectional diagram cut along a line 1B–1B shown in FIG. 1A.

In FIG. 1A, a reference numeral 101 denotes a high-power compound semiconductor chip (whose output power is, for example, over 1.0 W) including an amplifier circuit for a microwave band (1~30 GHz), 107 denotes an input matching circuit for carrying out impedance matching at the input side of the amplifier circuit, and 108 denotes an output matching circuit for carrying out impedance matching at an output side of the amplifier circuit. Note, the semiconductor chip 101, the input matching circuit 107, and the output matching circuit 108 are disposed in a package 104 to constitute a high-power microwave semiconductor device.

Namely, in the high-power microwave semiconductor device according to the related art, the semiconductor chip 101 is positioned between the input matching circuit 107 and the output matching circuit 108, input side electrodes of the semiconductor chip 101 are connected to electrodes (or metallic portions) 171 of the input matching circuit 107 by bonding wires 131, and output side electrodes of the semiconductor chip 101 are connected to electrodes (or metallic portions) 181 of the output matching circuit 108 by bonding wires 132.

Further, as shown in FIGS. 1A and 1B, an input transmission line 109 is inserted between an input terminal 105 and the input matching circuit 107, and an output transmission line 110 is inserted between an output terminal 106 and the output matching circuit 108.

The input transmission line 109 is used to carry out a fine control of the impedance matching at the input side of the amplifier circuit, and the input transmission line 109 is used to carry out a fine control of the impedance matching at the output side of the amplifier circuit. The semiconductor chip 101 comprises a plurality of FETs (Field Effect Transistors) connected to constitute the amplifier circuit, input microwave signals to be amplified are supplied from the input terminal 105 to the amplifier circuit in the semiconductor chip 101 through the input transmission line 109 and the input matching circuit 107, and output microwave signals amplified by the amplifier circuit are transferred to the output terminal 106 through the output matching circuit 108 and the output transmission line 110. Consequently, the input microwave signals supplied to the input terminal 105 of the microwave semiconductor device are amplified by the microwave semiconductor device and output from the output terminal 106 of the microwave semiconductor device. Note, as shown in FIG. 1B, the semiconductor chip 101 is mounted on a stage portion 100 which is a part of the package 104.

Next, a method of producing a microwave semiconductor device according to the related art will be explained.

In the method of producing the microwave semiconductor device according to the related art, the semiconductor chip 101 is directly disposed at the stage portion 100 which is positioned between the input matching circuit 107 and the output matching circuit 108 in the package 104, and then, the semiconductor chip 101 is fixed to the stage portion 100, or the surface of the package 104 by heating and melting a gold-tin alloy and by carrying out a scrub process (which is a process of scrubbing the semiconductor chip 101 on the surface of the package 104).

Incidentally, the high-power microwave semiconductor chip 101 is formed thinly (i.e., of a very small thickness dimension in a direction transverse to the stage portion 100, generally, below 100 μm) so as to effectively radiate the heat which is caused thereby, because the semiconductor chip 101 consumes a large amount of power and a large amount of heat is produced thereby. Note, the semiconductor chip 101 used for a high-power microwave semiconductor device, which is, for example, made of compound semiconductor material (for example, made of Gallium Arsenide (GaAs)), is more delicate than that of silicon (Si), and thus the compound semiconductor chip 101 may be broken during the scrub process. Furthermore, when electrical characteristics of the semiconductor chip 101 are ascertained to be inferior after affixing the semiconductor chip to the package 104, it is difficult to remove the semiconductor chip 101 from the package 104. Consequently, the semiconductor chip 101 and the associated package 104 which includes the input matching circuit 107, the output matching circuit 108, and the like must be all rejected.

Figure 2A:
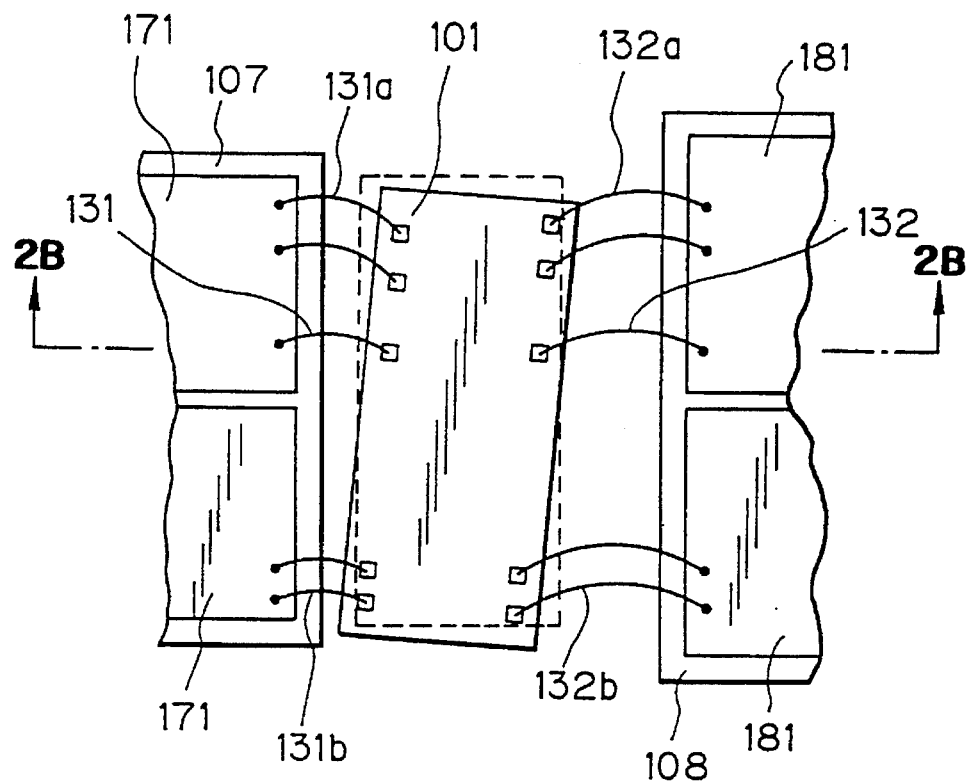
FIGS. 2A and 2B diagrams for explaining problems which arise in a method of producing the microwave semiconductor device according to the related art.
Figure 2B:
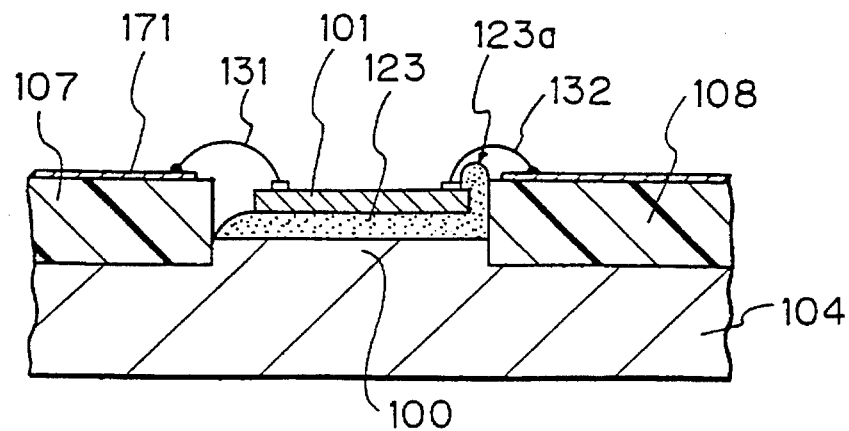

FIG. 2A is a plan diagram for explaining problems which arise in a method of producing the microwave semiconductor device according to the related art, and FIG. 2B is a sectional diagram cut along a 2B—2B line shown in FIG. 2A.

As shown in FIG. 2A, when carrying out the scrub process after disposing the semiconductor chip 101 on the stage portion 100 positioned between the input matching circuit 107 and the output matching circuit 108, the intended, fixed position of the semiconductor chip 101 may be shifted (from dashed to solid line positions as shown with reference to FIG. 2A), and error inductances may be caused at both sides of the amplifier circuit by the resulting different lengthes of the respective bonding wires 131a versus 131b and 132a versus 132b, respectively. Namely, as clearly shown in FIG. 2A, when carrying out the scrub process, the fixed position of the semiconductor chip 101 may be shifted and a length of a bonding wire 131a connected between the input matching circuit 107 and the semiconductor chip 101 may be different from that of a bonding wire 131b, so that an inductance caused by the bonding wire 131a is different from that caused by the bonding wire 131b.

Similarly, the length of a bonding wire 132a connected between the output matching circuit 108 and the semiconductor chip 101 may be different from that of a bonding wire 132b, so that an inductance caused by the bonding wire 132a is different from that caused by the bonding wire 132b. Namely, in the microwave semiconductor device according to the related art, error inductances (corresponding to references $L_{EI}$ and $L_{EO}$ in the equivalent circuit of FIG. 5), which exist at the input side and the output side of the amplifier circuit caused by the bonding wires 131 (131a, 131b) and 132 (132a, 132b), become large, when the fixed position of the semiconductor chip 101 is shifted and the lengthes of the bonding wires are different. Consequently, required electrical characteristics may not be obtained.

Furthermore, as shown in FIG. 2B, while carrying out the scrub process, a solder layer 123 made of a gold-tin alloy may creep up onto an upper surface of the semiconductor chip 101 from beneath the semiconductor chip 101. As a result, a top portion 123a of the solder layer 123 may form over and become connected to electrodes of the semiconductor chip 101 or to bonding wires connected between the matching circuits 107, 108 and the semiconductor chip 101, so that short-circuits between the electrodes of the semiconductor chip 101 and/or the matching circuits 107, 108 may be caused. Note, it is possible to avoid the creeping up of the gold-tin alloy layer 123 by mounting the input matching circuit 107 and the output matching circuit 108 so as to have a sufficient space therebetween, or to have sufficient spaces between the input matching circuit 107 and the semiconductor chip 101 and between the output matching circuit 107 and the semiconductor chip 101. However, when mounting the input matching circuit 107 and the output matching circuit 108 so as to have such a sufficient space therebetween, the influence on the matching of the error inductances of the bonding wires become a large, so that required electrical characteristics cannot be obtained.

Next, the preferred embodiments of a chip carrier and a microwave semiconductor device, and a method of producing the microwave semiconductor device, according to the present invention will be explained below.

Figure 3A:
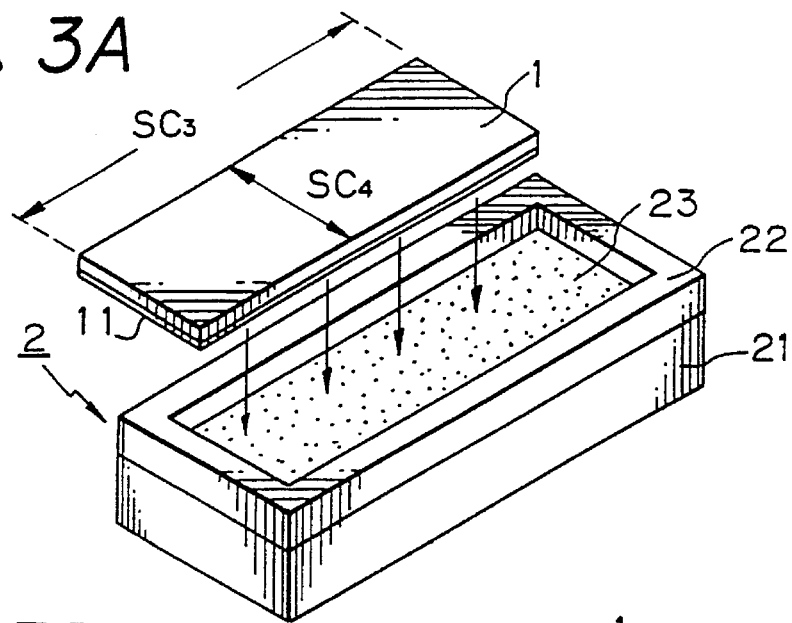
FIG. 3A to 3C are diagrams indicating an embodiment of a chip carrier according to the present invention.
Figure 3B:
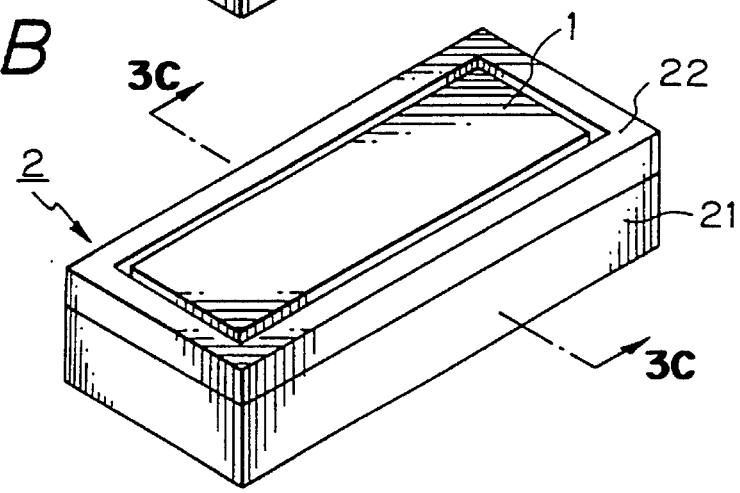
Figure 3C:
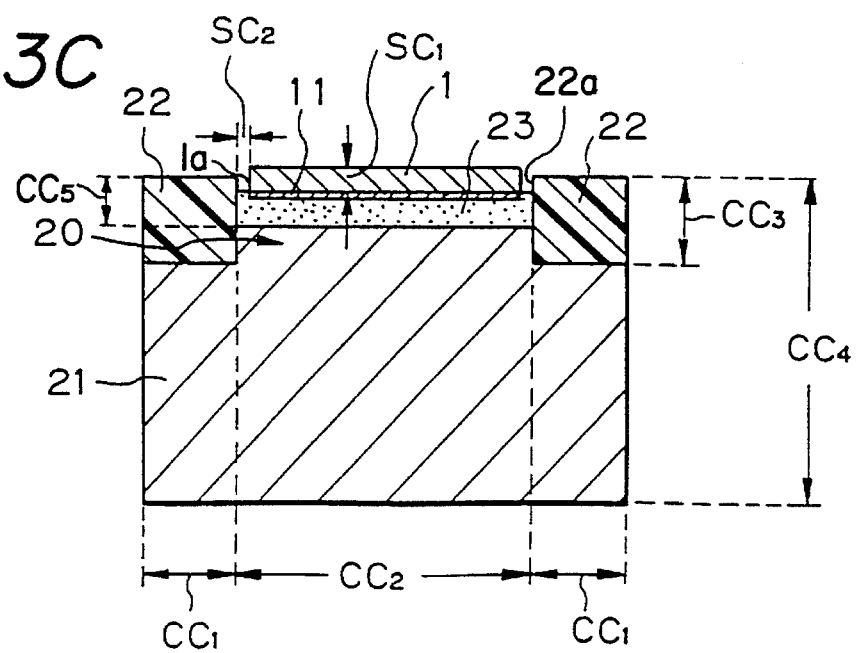

FIG. 3A to 3C are diagrams indicating an embodiment of a chip carrier according to the present invention. Note, FIG. 3C is a sectional diagram cut in a plane along a 3C—3C shown in FIG. 3B, and FIGS. 3A to 3C are labelled with dimensional references for indicating typical sizes of a semiconductor chip and a chip carrier.

In FIGS. 3A to 3C, a reference numeral 1 denotes a semiconductor chip (high-power compound microwave semiconductor chip) including a high-power microwave amplifier circuit, and 2 denotes a chip carrier on which affixing the semiconductor chip 1 thereon. Note, as shown in FIGS. 3A to 3C, the semiconductor chip 1 is made of a compound semiconductor material (for example, gallium arsenide (GaAs)), a length $SC_3$ of the semiconductor chip 1 is specified as 1.5 mm, a width $SC_4$ of the semiconductor chip 1 is specified as 500 μm, and a thickness $SC_1$ of the semiconductor chip 1 is specified as below 100 μm to effectively radiate the heat caused thereby. The chip carrier 2 comprises a conductive holder 21 made of gold-plated copper, an insulative collar member 22 made of ceramic, and a solder layer 23 made of gold-tin alloy. Note, as shown in FIGS. 3A and 3B, the solder layer 23 corresponds to and is formed with a concave recess of the chip carrier 2, and thus the solder layer 23 is positioned to engage the bottom surface 11 of the semiconductor chip 1, when disposing the semiconductor chip 1 on the chip carrier 2. Note, gold is plated on the bottom surface 11 of the semiconductor chip 1.

As shown in FIG. 3A, first, the semiconductor chip 1 is disposed in the concave recess of the chip carrier 2. Next, the chip carrier 2 carrying the semiconductor chip 1 is heated at a specific temperature (for example, 350° C.) to melt the solder layer 23, and thereby to fix the semiconductor chip 1 on the chip carrier 2 (or, in the concave recess of the chip carrier 2). Namely, after melting the solder layer 23, the chip carrier 2 including the semiconductor chip 1 thereon is cooled, so that the bottom surface 11 of the semiconductor chip 1, on which gold is plated, is fixed to the upper surface of the mounting portion 20 of chip carrier 2, made of copper, through the solder layer 23 made of gold-tin alloy. Note, the bottom surface 11 of the semiconductor chip 1 is specified to be maintained at a ground potential level for operation of the semiconductor chip 1, and thus the conductive holder 21, which is made of gold-plated copper, is used to bring out the ground potential level when the semiconductor chip 1 is mounted thereon.

In the above descriptions, as shown in FIG. 3C, the size of the concave recess (defined by the spacing between the opposed walls 22a of the insulative collar member 22) of the semiconductor chip carrier 2 is formed in accordance with the size of the semiconductor chip 1, and thus a positional discrepancy of the concave recess relatively to the semiconductor chip 1 cannot occur, namely, the semiconductor chip 1 is exactly disposed within the concave recess and thus relatively to the semiconductor chip carrier 2 (with reference to FIGS. 3B and 3C). For example, a space ($SC_2$) between an outer edge 1a of the semiconductor chip 1 and the inner wall 22a of the insulative collar member 22 (which defines the concave recess of the chip carrier 2) is specified at below 100 μm, and is preferably specified at below 50 μm.

As one example of the size of the chip carrier 2, which is determined in accordance with the size of the semiconductor chip 1, a width $CC_1$ of the insulative collar member 22 is specified as 100 μm, a width $CC_2$ between the inner sidewalls 22a of the insulative collar member 22 (likewise, the width $CC_2$ of the chip mounting portion 20) is specified as 600 μm, a thickness $CC_3$ of the insulative collar member 22 is specified as 300 μm, a thickness $CC_4$ of the chip carrier is specified as 650 μm, and a depth $CC_5$ of the concave recess of the chip carrier 2 is specified as 200 μm. Note, it is obvious that these sizes $CC_1$~$C_5$ are changed in accordance with a size of the semiconductor chip 1. Especially, the depth $CC_5$ of the concave recess of the chip carrier 2 is formed in accordance with the thickness $SC_1$ of the semiconductor chip 1, so that the creeping up of the gold-tin alloy of layer 23 reaching an upper surface of the semiconductor chip 1 can be avoided. Further, the semiconductor chip 1 can be constituted as a monolithic microwave integrated circuit (MMIC) chip. Note, the MMIC chip is, for example, used for a high power microwave amplifier device, and the lateral size of the MMIC chip must be made large and the thickness of the MMIC chip must be made very small (i.e., very thin).

As described above, according to a chip carrier of the present invention, the handling of the semiconductor chip 1 (for example, made of GaAs) having a weak mechanical strength can be converted to handling of the semiconductor chip carrier 2 (which comprises a conductive holder 21 made of gold-plated copper and an insulative collar member 22 made of ceramic) having a high mechanical strength, and thus work efficiency can be improved.

Figure 4A:
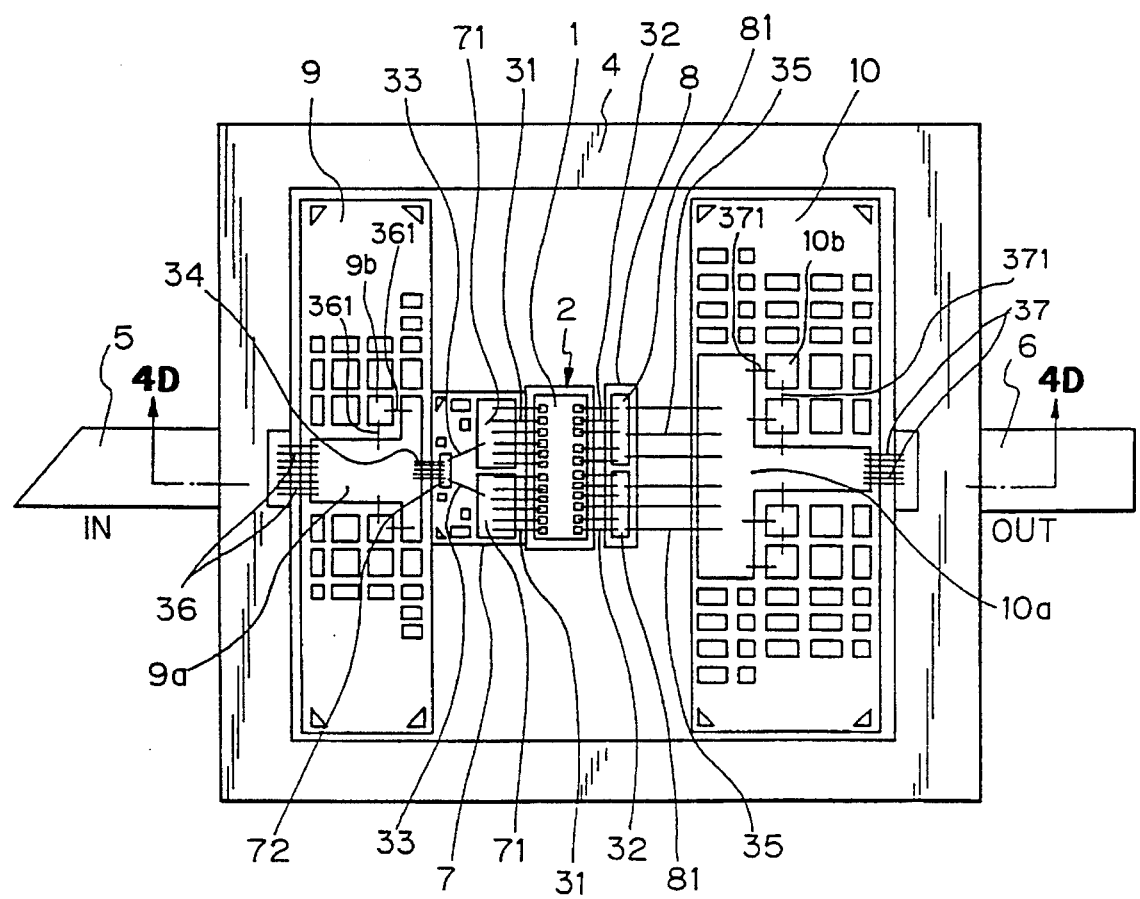
FIGS. 4A and 4B are diagrams indicating an embodiment of a microwave semiconductor device according to the present invention.
Figure 4B:
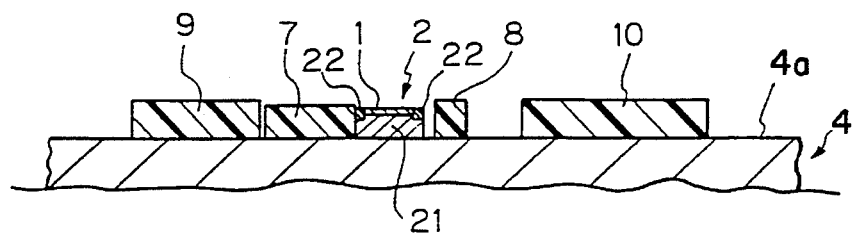

FIG. 4A is a plan diagram indicating an embodiment of a microwave semiconductor device according to the present invention, and FIG. 4B is a sectional diagram in a plane cut along a D—D line shown in FIG. 4A. Comparing FIGS. 4A and 4B to FIGS. 1A and 1B, in the microwave semiconductor device shown in FIGS. 4A and 4B, the semiconductor chip 1 is mounted on the chip carrier 2 which was already explained above, and the other configurations are the same as those shown in FIGS. 1A and 1B.

In FIG. 4A, a reference numeral 1 denotes a high-power compound semiconductor chip (whose output power is, for example, over 1.0 W) including an amplifier circuit for a microwave band (1~30 GHz), 2 denotes a chip carrier which was already explained with reference to FIGS. 3A to 3C, 4 denotes a package having an input terminal 5 and an output terminal 6, 7 denotes an input matching circuit, 8 denotes an output matching circuit, 9 denotes an input transmission line, and 10 denotes an output transmission line.

As shown in FIGS. 4A and 4B, the input matching circuit 7, which is provided in the package 4 and connected between the input transmission line 9 and the semiconductor chip 1, is used to carry out impedance matching at the input side of the amplifier circuit included in the semiconductor chip 1. The output matching circuit 8, which is provided in the package 4 and connected between the semiconductor chip 1 and the output transmission line 10, is used to carry out impedance matching at an output side of the amplifier circuit. Note, the input transmission line 9 is connected to the input terminal 5 of the package 4 by a plurality of bonding wires 36, and is connected to the input matching circuit 7 by a plurality of bonding wires 34. Similarly, the output transmission line 10 is connected to the output terminal 6 of the package 4 by a plurality of bonding wires 37, and is connected to the output matching circuit 8 by a plurality of bonding wires 35.

Further, as shown in FIGS. 4A and 4B, the semiconductor chip 1 fixed on the chip carrier 2 is positioned between the input matching circuit 7 and the output matching circuit 8, input side electrodes of the the semiconductor chip 1 are connected to electrodes (or metallic portions) 71 of the input matching circuit 7 by a plurality of bonding wires 31, and output side electrodes of the semiconductor chip 1 are connected to electrodes (or metallic portions) 81 of the output matching circuit 8 by a plurality of bonding wires 32, so that a high-power microwave semiconductor device is constituted. Note, in the input matching circuit 7, an electrode 72, which is connected to the input transmission line 9 by the bonding wires 34, is connected to the electrodes 71 by bonding wires 33. Furthermore, the input transmission line 9 is used to carry out a fine control of the impedance matching at the input side of the amplifier circuit, by connecting or not connecting metallic portions 9b to an electrode (metallic portion) 9a by bonding wires 361. Similarly, the output transmission line 10 is used to carry out a fine control of the impedance matching at the output side of the amplifier circuit, by connecting or not connecting metallic portions 10b to an electrode (metallic portion) 10a by bonding wires 371. In addition, the rear (bottom surface 11) of the semiconductor chip 1 is specified at a ground potential level of the semiconductor chip 1, and the conductive holder 21, which is made of gold-plated copper, is used to bring out the ground potential level (i.e., to provide an external connection thereof) by mounting the semiconductor chip 1 thereon.

As already described above, the semiconductor chip 1, which is made of compound semiconductor material (for example, GaAs), comprises a plurality of FETs (Field Effect Transistors) connected so as to constitute the amplifier circuit, input microwave signals to be amplified are supplied from the input terminal 5 to the amplifier circuit in the semiconductor chip 1 through the input transmission line 9 and the input matching circuit 7, and output microwave signals amplified by the amplifier circuit are transferred to the output terminal 6 through the output matching circuit 8 and the output transmission line 10. Consequently, the input microwave signals supplied to the input terminal 5 of the microwave semiconductor device are amplified by the microwave semiconductor device and output from the output terminal 6 of the microwave semiconductor device.

Note, with comparing FIG. 4B illustrating the microwave semiconductor device according to the present invention to FIG. 1B, the stage portion 100 which is a part of the package 104 of the related art can be deleted, and thus the upper main surface 4A of the package 4 of the present invention is flat. Consequently, the package 4 is not limited to use only as the microwave semiconductor device, but it can be broadly used for various semiconductor devices.

Next, processes of producing the microwave semiconductor device will be explained with reference to FIGS. 4A and 4B.

First, a semiconductor chip 1 is mounted on a chip carrier 2 including a conductive holder 21 and an insulative collar member 22, by positioning the semiconductor chip 1 within the inner walls of the insulative collar member 22 provided at the periphery of the conductive holder 21. Next, the chip carrier 2 is heated to melt a solder layer 23 (for example, made of gold-tin alloy) provided on the holder and thereby to fix the semiconductor chip 1 onto the conductive holder 21. Note, these processes were already explained. Further, an input matching circuit 7, an output matching circuit 8, an input transmission line 9, and an output transmission line 10 are provided in the package 4.

Next, the chip carrier 2 with the semiconductor chip 1 affixed thereon is disposed at the position between the input matching circuit 7 and the output matching circuit 8 in the package 4, and then the package 4 is heated to about 350° C., and the chip carrier 2 thereby is fixed to the surface 4a of the package 4. Namely, the bottom surface of the chip carrier 2 (i.e., the bottom surface of the conductive holder 21), which is plated with gold, is fixed to the surface 4a of the package 4 by heating and melting a gold-tin alloy which is previously provided at the position where the chip carrier 2 is to be fixed on the package 4, and by carrying out a scrub process. Note, in this case, the chip carrier 2 is again heated to about 350° C., but the solder layer 23 is not again melted, because the melting point of the material of the solder layer 23 after being melted and soldered is higher than that of the original solder layer 23 (for example, made of gold-tin alloy) before being melted.

The scrub process is carried out by scrubbing the chip carrier 2. Note, the semiconductor chip 1 (for example, made of GaAs) has a weak, or low, mechanical strength, but the chip carrier 2 (which comprises a conductive holder 21 made of gold-plated copper and an insulative collar member 22 made of ceramic) has a strong, or high, mechanical strength, and thus work efficiency can be improved. Namely, position adjustment of the semiconductor chip 1 is carried out by moving the chip carrier 2, and thus handling of the semiconductor chip becomes easy and the accuracy of disposing the semiconductor chip 1 mounted on the chip carrier 2 can be improved. Furthermore, breakage of the semiconductor chip 1 caused during handling as in the related art can be avoided.

Next, wire-bonding processes are carried out. Namely, wire-bonding processes for connecting bonding wires between electrodes (metallic portions) 71 of the input matching circuit 7 and input side electrodes of the semiconductor chip 1, output side electrodes of the semiconductor chip 1 and electrodes (metallic portions) 81 of the output matching circuit 8, and the like, are carried out. After the wire-bonding processes, the package 4 is closed (i.e., sealed) and a salable microwave semiconductor device is provided.

Figure 5:
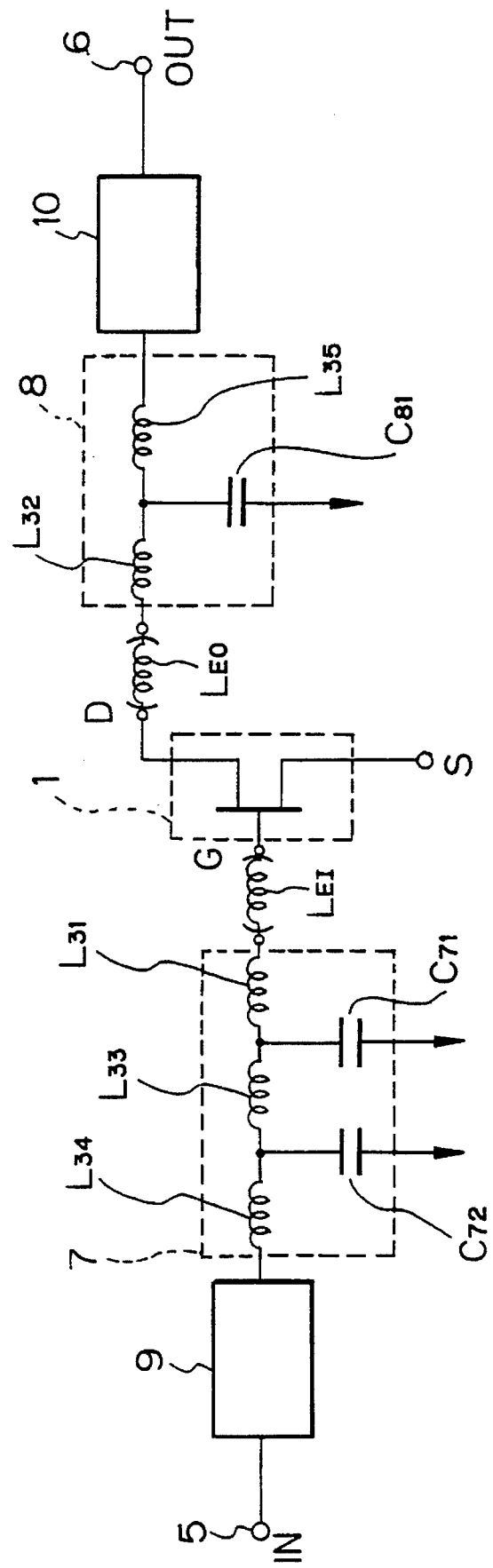
FIG. 5 is an equivalent circuit diagram indicating the microwave semiconductor device shown in FIG. 4A.

FIG. 5 is an equivalent circuit diagram indicating the microwave semiconductor device shown in FIG. 4A. As shown in FIG. 5, the semiconductor chip 1 includes a plurality of FETs (Field Effect Transistors) each having a gate (G), a drain (D), and a source (S), as shown for a single such illustration FET in FIG. 5, connected so as to constitute a high-power microwave amplifier circuit. The bonding wires 31, 32, 33, 34, and 35 correspond to inductances $L_{31}$, $L_{32}$, $L_{33}$, $L_{34}$, and $L_{35}$, and the electrodes (metallic portions) 71, 72, 81 correspond to capacitive reactances $C_{71}$, $C_{72}$, and $C_{81}$, respectively. As already described above, the input matching circuit 7, which includes the inductances $L_{31}$, $L_{33}$, $L_{34}$ and the reactances $C_{71}$, $C_{72}$, is used to carry out the impedance matching at the input side of the amplifier circuit (1), and the input transmission line 9 is used to carry out a fine control of the impedance matching at the input side of the amplifier circuit. Similarly, the output matching circuit 8, which includes the inductances $L_{32}$, $L_{35}$ and the reactance $C_{81}$, is used to carry out the impedance matching at the output side of the amplifier circuit (1), and the output transmission line 10 is used to carry out fine control of the impedance matching at the output side of the amplifier circuit.

Note, in FIG. 5, a reference $L_{EI}$, denotes an error inductance at the input side of the amplifier circuit caused by the bonding wires 31, and a reference $L_{EO}$ denotes an error inductance at the output side of the amplifier circuit caused by the bonding wires 32. In the microwave semiconductor device according to the related art shown in FIG. 1A, these error inductances $L_{EI}$ and $L_{EO}$ become large, when the fixed position of the semiconductor chip 101 is shifted (with reference to FIG. 2A) and the respective lengths of the bonding wires are different. However, in the microwave semiconductor device according to the present invention shown in FIG. 4A, the error inductances $L_{EI}$ and $L_{EO}$ do not become large, or the error inductances $L_{EI}$ and $L_{EO}$ can be regarded as zero, because the semiconductor chip 1 (chip carrier 2) can be easily mounted on an exact portion of the surface 4a of the package 4 and the length of each of the bonding wires is determined at a specific (or required) value.

Figure 6:
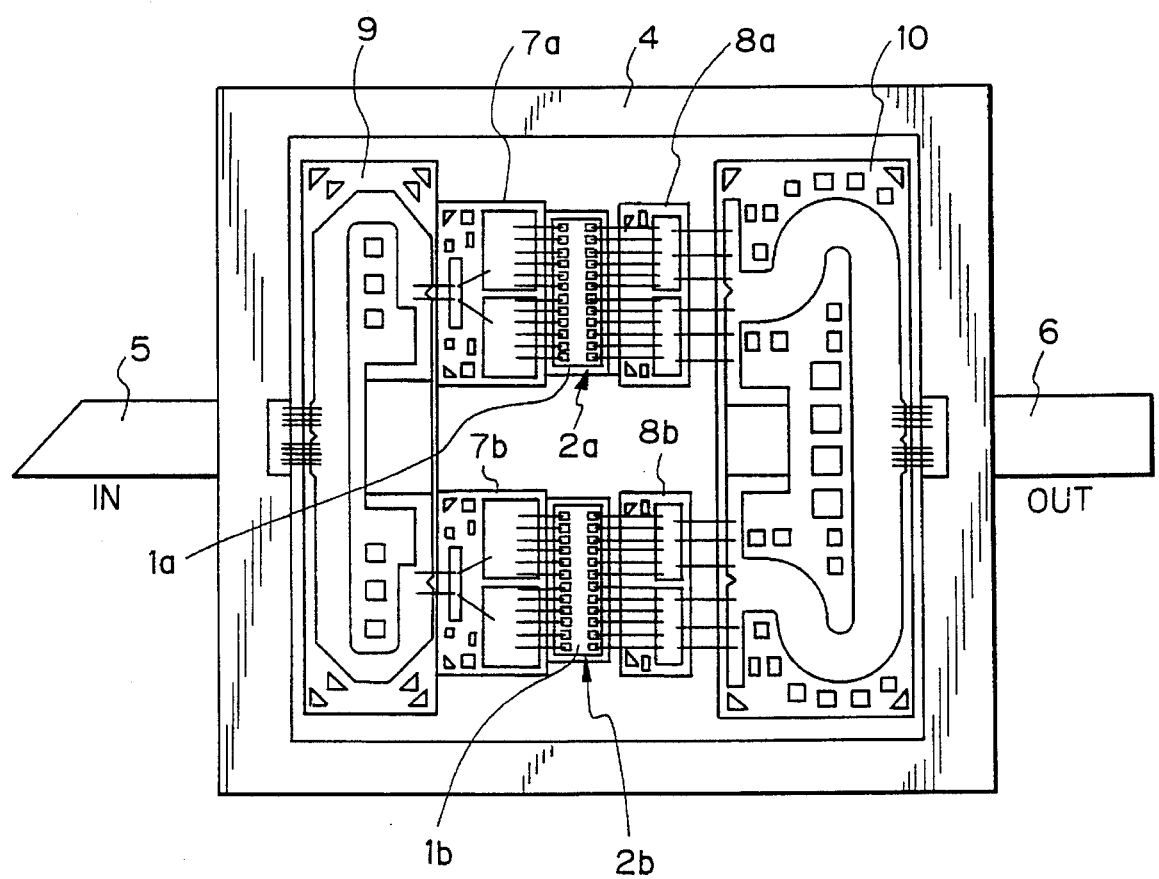
FIG. 6 is a diagram indicating another embodiment of a microwave semiconductor device according to the present invention.

FIG. 6 is a diagram indicating another embodiment of a microwave semiconductor device according to the present invention.

As shown in FIG. 6, the semiconductor chip 1 shown in FIG. 4A can be plurally provided in the package 1. Namely, in the microwave semiconductor device shown in FIG. 6, two input matching circuits 7a and 7b, two semiconductor chips 1a and 1b, and two output matching circuits 8a and 8b are provided in a package 4. Namely, two groups respectively comprising the input matching circuits 7a, 7b, the semiconductor chips 1a, 1b, and the output matching circuits 8a, 8b are provided between the input transmission circuit 9 and the output transmission circuit 10. The other configurations are the same as the microwave semiconductor device shown in FIG. 4A, and the explanations thereof are omitted. Note, in the microwave semiconductor according to the present invention, the number of the groups each comprising the input matching circuit, the semiconductor chips, and the output matching circuits is not limited to one or two, but the number of the groups can be an optional number.

Figure 7A:
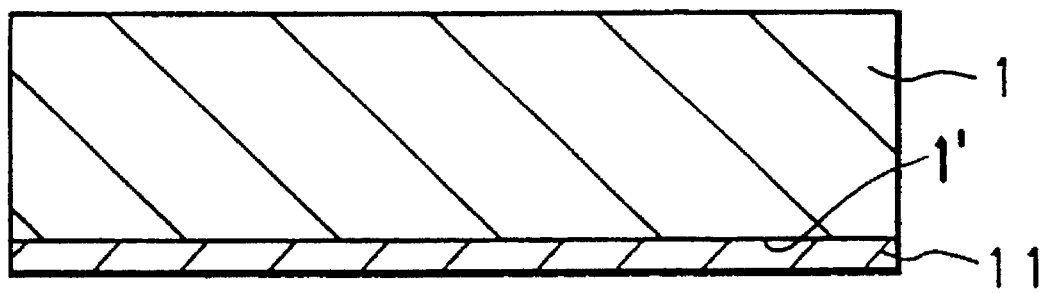
FIGS. 7A and 7B are diagrams for explaining problems when mounting a semiconductor chip on a chip carrier.
Figure 7B:
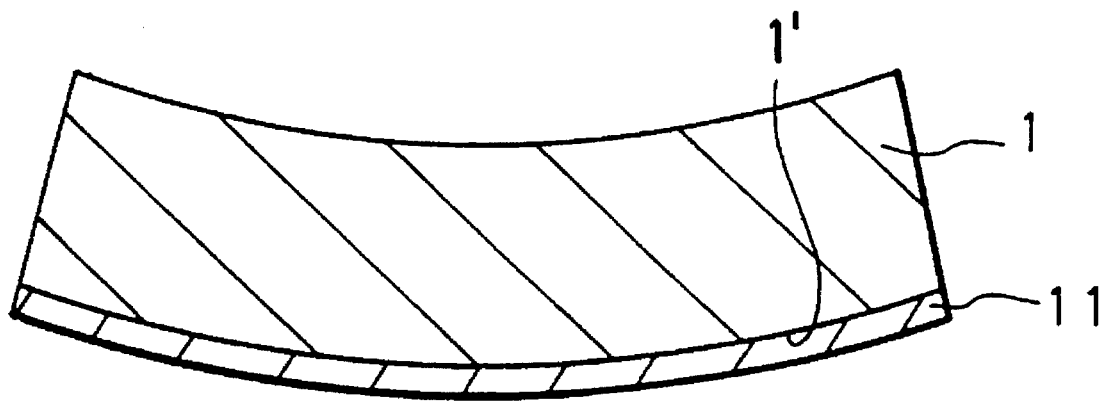

FIGS. 7A and 7B are diagrams for explaining problems when mounting a semiconductor chip on a chip carrier.

As described above with reference to FIGS. 3A to 3C, a semiconductor chip 1, whose bottom surface 1 is plated with a gold layer 11, is disposed on the concave recess of a chip carrier 2, and then the chip carrier 2 carrying the semiconductor chip 1 is heated at a specific temperature (for example, 350° C.) to melt the solder layer (23), and thereby to fix the semiconductor chip 1 on the chip carrier 2 (and thus, in the concave recess). Note, as shown in FIG. 7A, before heating the semiconductor chip 1 (or the chip carrier 2), the shape of the semiconductor chip 1 is flat. However, as shown in FIG. 7B, after heating the semiconductor chip 1, the shape of the semiconductor chip 1 may be curved, because a thermal expansion coefficient of the bottom layer 11 (which is made of gold) is larger than that of semiconductor chip 1 (which is made of GaAs). Consequently, after fixing the semiconductor chip 1 on the chip carrier 2, the semiconductor chip 1 may be curved and not exactly fixed onto the chip carrier 2. This problem is more serious when the size of the semiconductor chip 1 becomes larger, especially when the semiconductor chip 1 is used for a monolithic microwave integrated circuit (MMIC) chip of a high power microwave amplifier device. Note, the size of the MMIC chip must be made large (for example, a square shape of several millimeters (mm)), and the thickness of the MMIC chip must be made thin (for example, several hundred micrometers (μm)).

Figure 8A:
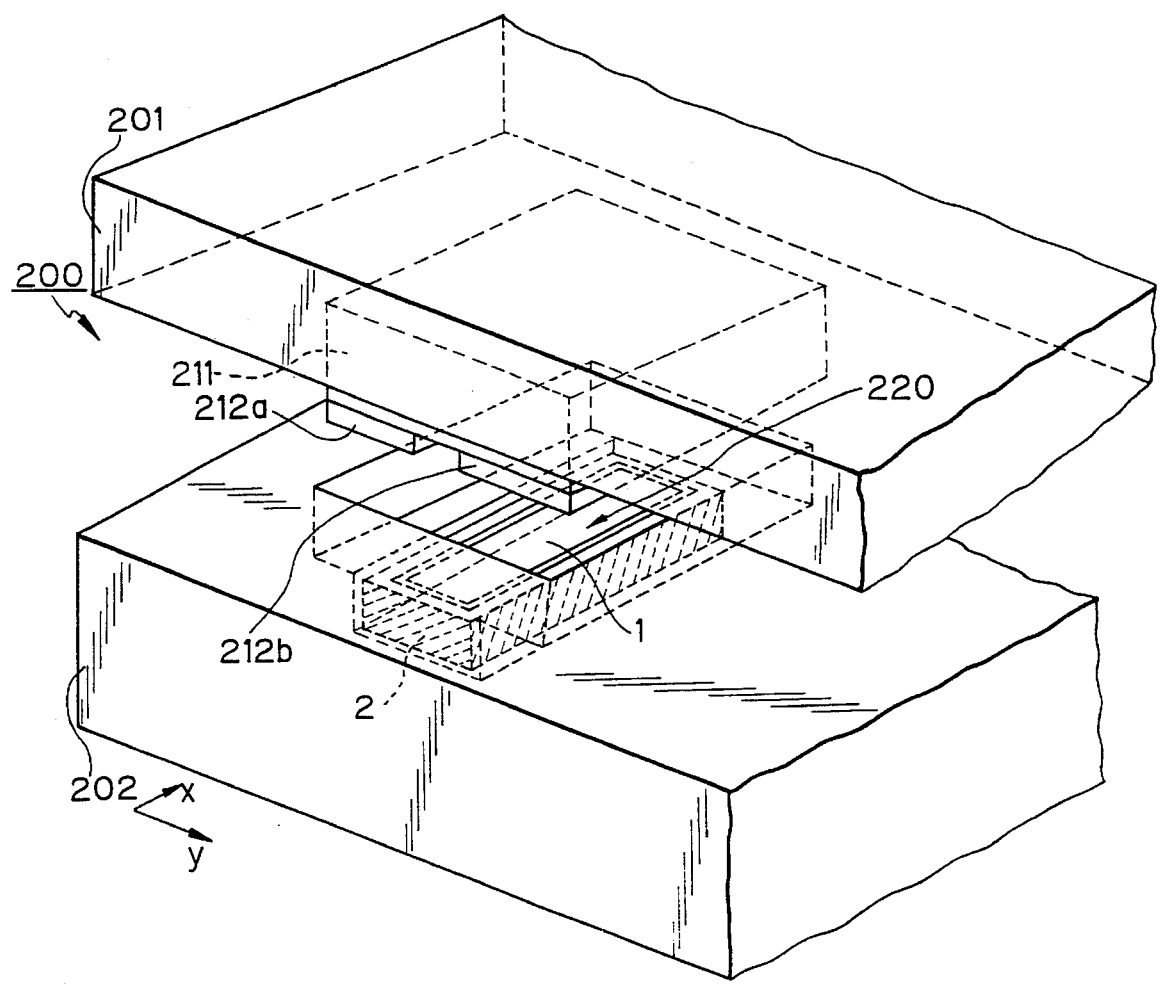
FIGS. 8A and 8C are diagrams indicating a semiconductor chip fixing apparatus used when mounting the semiconductor chip on the chip carrier according to the present invention.
Figure 8B:
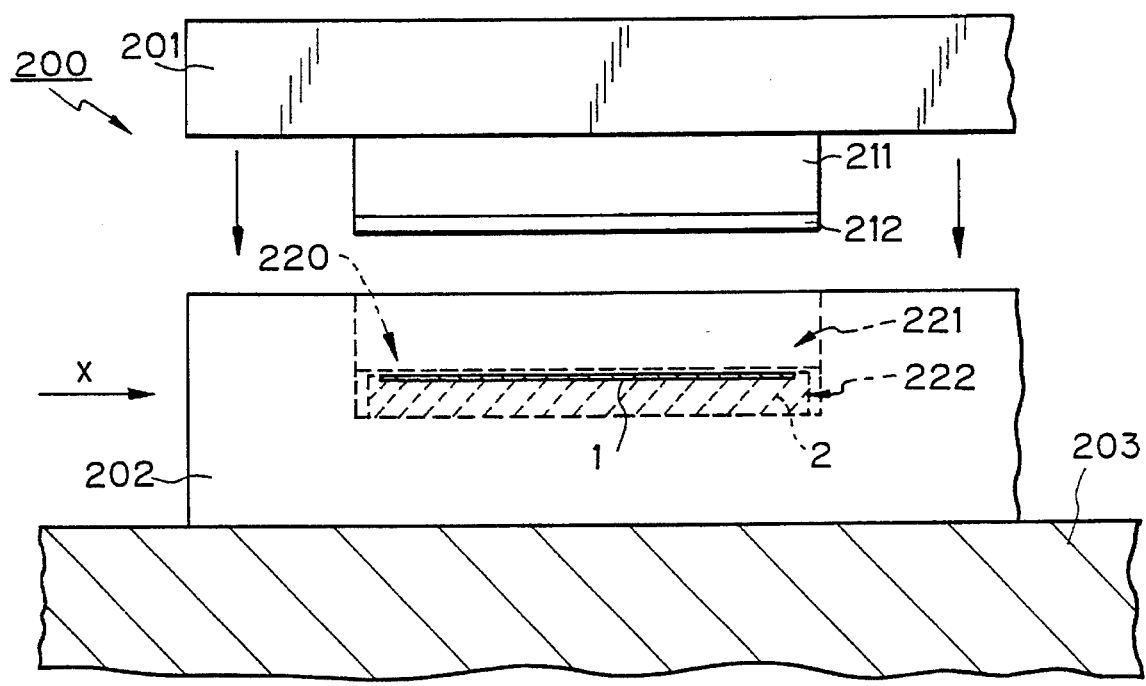
Figure 8C:
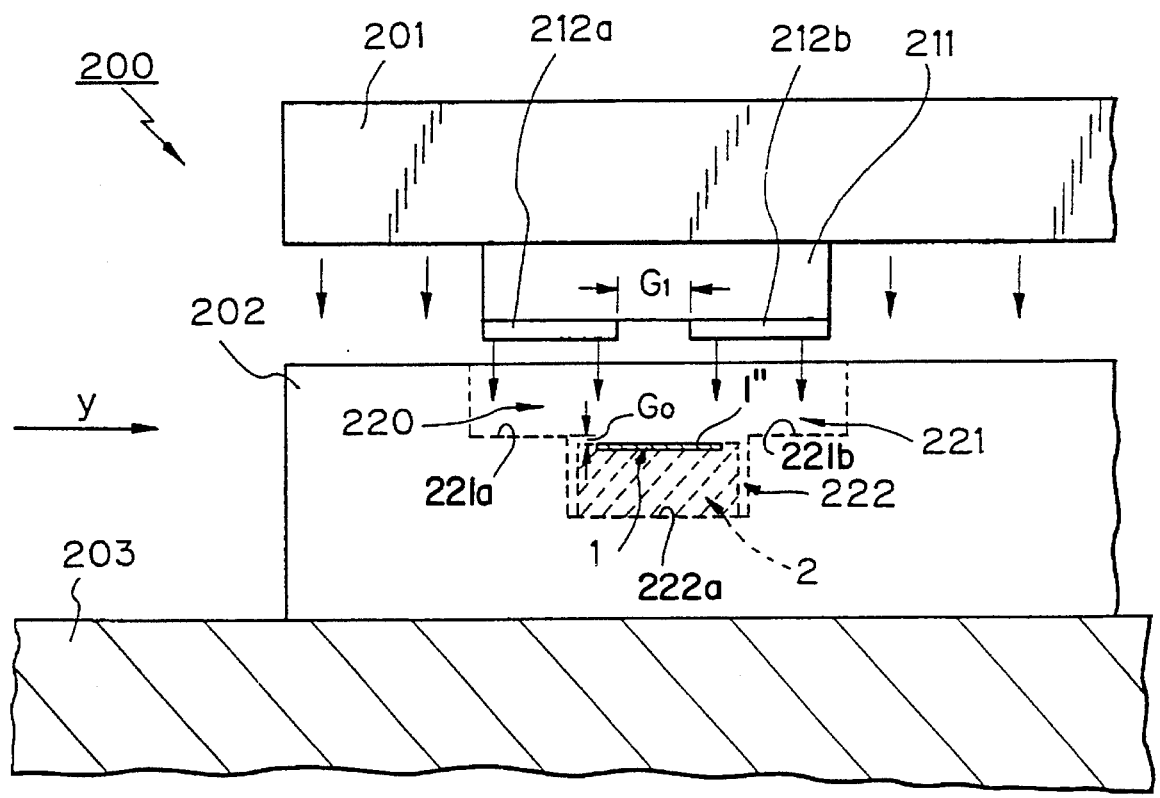
Figure 9:
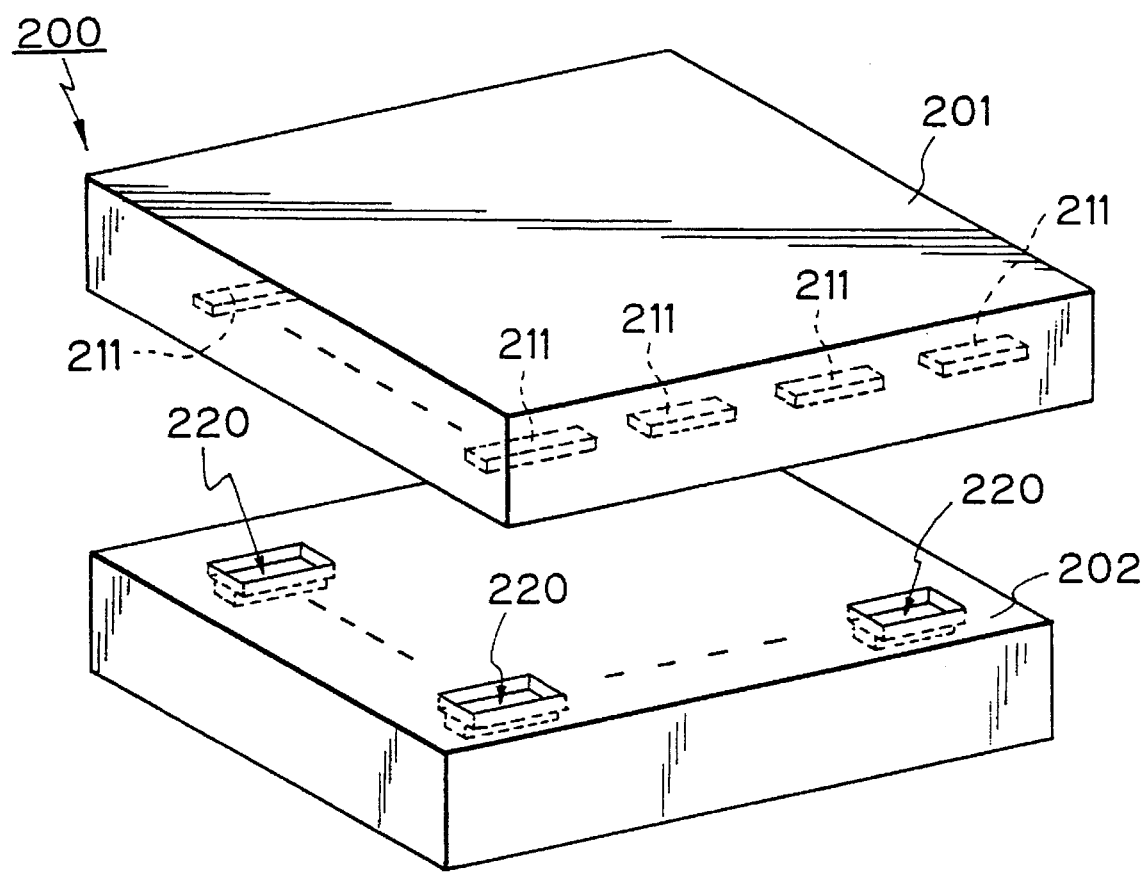
FIG. 9 is a diagram indicating the entirety of the semiconductor chip fixing apparatus shown in FIGS. 8A to 8C.

FIGS. 8A to 8C are diagrams indicating a semiconductor chip fixing apparatus used when mounting the semiconductor chip on the chip carrier according to the present invention, and FIG. 9 is a diagram indicating the entire semiconductor chip fixing apparatus shown in FIGS. 8A to 8C.

As shown in FIG. 8A, a semiconductor chip fixing apparatus 200, which is used to maintain a flat shape of the semiconductor chip 1 during fixing of the semiconductor chip 1 onto the chip carrier 2 by applying heat, comprises an upper tray 201 and a lower tray 202, and the upper tray 201 and the lower tray 202 are made of gold-plated brass. As shown in FIGS. 8A to 8C, the upper tray 201 comprises a convex projection 211, and the lower tray 202 comprises a concave recess 220.

The concave recess 220 of the lower tray 202 is constituted by a first concave recess 221 and a second concave portion 222. The first concave portion 221 is formed to be suitable for receiving the convex projection 211 of the upper tray 201, and the second concave recess 221 is formed to receive and mount the chip carrier 2 carrying the semiconductor chip 1.

In the above description, as shown in FIGS. 8B and 8C, the lower tray 202 is mounted on a hot plate 203 to heat the chip carrier 2 disposed in the second concave portion 222 to a specific temperature (for example, 350° C.) and to melt the solder layer (23). Further, as shown in FIG. 8C, press boards 212a and 212b, which are made of alumina (aluminum oxide: $Al_2O_3$), are provided at both sides of the convex portion 211, and a gap $G_1$ between the press boards 212a and 212b is positioned at the portion corresponding to a center portion of the semiconductor chip 1 where semiconductor elements (field effect transistors) are formed so that the center portion is not pressed by the press boards 212a and 212b (or the convex projection 211). Furthermore, the height of the convex projection 211 is specified as greater than the depth of the first concave recess 221 by 0.5~1.0 mm to engage the surfaces of the press boards 212a and 212b on the spaced bottom wall surfaces 221a and 221b of the first concave recess 221 (see, FIG. 8C). In addition, the bottom wall surfaces 221a and 221b of the first concave portion 221 are positioned above the upper surface 1' of the semiconductor chip 1 by a gap $G_0$, when the semiconductor chip 1 is disposed on the chip carrier 2 which is mounted on the bottom wall surface 222a of the second concave recess 222, and the gap $G_0$ is, for example, specified as 5~10 μm.

Note, as shown in FIG. 9, the upper tray 201 can be constituted to include a plurality of convex projections 211, and the lower tray 202 can be constituted to include a plurality of concave recesses 220 each comprising a first concave recess 221 and a second concave recess 222.

Next, processes of producing the microwave semiconductor device using the above semiconductor chip fixing apparatus will be explained.

As described above, first, a semiconductor chip 1 is mounted in a concave recess (defined by the inner walls of a insulative collar member 22) of a chip carrier 2. Next, the chip carrier 2 including the semiconductor chip 1 is disposed in a second concave recess 222 of a concave recess 220 in a lower tray 202, and an upper tray 201 is pressed onto the lower tray 202 so that surfaces of press boards 212a and 212b of the upper tray 201 are fitted to (i.e., engaged on) the bottom wall surfaces 221a and 221b of a first concave portion 221 of recess 220 in the lower tray 202. Further, the semiconductor chip fixing apparatus 200 (the lower tray 202) is mounted on a hot plate 203 to heat the chip carrier 2 disposed in the second concave portion 222 to a specific temperature (for example, 350° C.) and to melt the solder layer (23) for about 30 seconds, and then the semiconductor chip fixing apparatus 200 is removed from the hot plate 203 to cool the chip carrier 2 and thereby to fix the semiconductor chip 1 onto the chip carrier 2. Note, a gap $G_1$ is provided between the press boards 212a and 212b, and thus semiconductor elements formed at a center portion of the semiconductor chip 1 are not damaged. Further, the press boards 212a and 212b are made of $Al_2O_3$, and thus the surfaces of the press boards 212a and 212b do not adhere to the bottom walls 221a and 221b of the first concave portion 221 or to the surface of the chip carrier 2 (or to the upper surface 1' of the semiconductor chip 1).

Note, the following processes are the same as described above with reference to FIGS. 4A and 4B. Namely, after fixing the semiconductor chip on the chip carrier 2, the chip carrier 2 including the semiconductor chip 1 is disposed at the position between the input matching circuit 7 and the output matching circuit 8 in the package 4, and then the package 4 is heated at about 350° C., and the chip carrier 2 is fixed to the surface of the package 4. Note, in this case, the chip carrier 2 is again heated at about 350° C., but the solder layer 23 is not again melted and the semiconductor chip is not curved at that time, because the melting point of the material of the solder layer 23 after being melted and soldered is higher than that of the original solder portion 23 before being melted. Next, wire-bonding processes are carried out, and the package 4 is closed. Note, these processes are the same as those described with reference to FIGS. 4A and 4B. In accordance with a method of producing a microwave semiconductor device using the semiconductor chip fixing apparatus, after heating the semiconductor chip 1, the shape of the semiconductor chip 1 is not curved (shown in FIG. 7B), but it is maintained as a flat shape (shown in FIG. 7A).

In accordance with the present invention as described above, the handling of a semiconductor chip having a weak, or low mechanical strength can be converted to the handling of a chip carrier of the present invention having a strong, or high, mechanical strength by providing the semiconductor chip in the chip carrier. Further, the chip carrier can be fixed by exactly disposing it at the portion between an input matching circuit and an output matching circuit, so that the semiconductor chip can be easily mounted on an exact portion of a package. Furthermore, breakage of the semiconductor chip as is caused in the related art when carrying out a scrub process can be avoided, and further, creeping up of gold-tin alloy, which is used to fix the semiconductor chip to the package, with the result of reaching an upper surface of the semiconductor chip can be avoided, so that the yield rate thereof can be increased. In addition, when the semiconductor chip is ascertained to be inferior by the results of testing the microwave semiconductor device, the chip carrier only can be removed and rejected, and the package and matching circuits thereof can be reused, so that the production cost can be decreased.

Many widely differing embodiments of the present invention may be constructed without departing from the spirit and scope of the present invention, and it should be understood that the present invention is not limited to the specific embodiments described in this specification, except as defined in the appended claims.

I claim:

1. A chip carrier for a semiconductor chip, the chip having a specified thickness and lateral configuration and size, comprising:
    a conductive holder having a main surface including a mounting surface portion for mounting a semiconductor chip thereon and a peripheral surface portion surrounding the mounting surface portion; and
    an insulative collar member disposed on and affixed to the peripheral surface portion and having inner wall surfaces, transverse to the main surface and surrounding the mounting surface portion thereof, the collar member defining a recess of a depth, measured from the mounting surface portion of the main surface, and of a lateral configuration and size for receiving therein and positioning said semiconductor chip on said conductive holder.

2. A chip carrier as claimed in claim 1, wherein said semiconductor chip has a bottom surface specified at a ground potential level for operation of said semiconductor chip, said bottom surface of said chip being affixed to and electrically connected to said mounting surface portion of said conductive holder and said conductive holder being used to bring out said ground potential level of said bottom surface of said semiconductor chip for external electrical connection.

3. A chip carrier as claimed in claim 1, wherein said conductive holder is made of gold-plated copper, and said insulative collar member is made of ceramic.

4. A chip carrier as claimed in claim 1, wherein said chip mounting surface portion has lateral edges bordered by the inner wall surfaces of said insulative collar member.

5. A chip carrier as claimed in claim 4, further comprising a solder layer on said chip mounting surface portion and bonded to the bottom surface of said semiconductor chip received in said recess, thereby to fix said semiconductor chip thereon.

6. A chip carrier as claimed in claim 5, wherein said solder layer is made of a gold-tin alloy.

7. A chip carrier as claimed in claim 1, wherein a space between the lateral periphery of said semiconductor chip and the corresponding inner wall surfaces of said insulative collar member is less than 100 μm.

8. A chip carrier as claimed in claim 7, wherein a space between the lateral periphery of said semiconductor chip and the corresponding inner wall surfaces of said insulative collar member is less than 50 μm.

9. A chip carrier as claimed in claim 1, wherein said semiconductor chip is made of a compound semiconductor material.

10. A chip carrier as claimed in claim 9, wherein said semiconductor chip is made of Gallium Arsenide.

11. A chip carrier as claimed in claim 1, wherein the bottom surface of said semiconductor ship is plated with gold.

12. A chip carrier as claimed in claim 1, wherein said semiconductor chip comprises a plurality of field effect transistors connected so as to constitute an amplifier circuit.

13. A chip carrier as claimed in claim 1, wherein said semiconductor chip is a monolithic microwave integrated circuit chip.

14. A microwave semiconductor device comprising:
    a package having an input terminal and an output terminal;
    a semiconductor chip, including an amplifier circuit having input and output sides and operative for amplifying input microwave signals supplied to said input side and producing corresponding, amplified microwave signals at said output side thereof;
    a chip carrier, said semiconductor chip being received on and affixed to said chip carrier and said chip carrier having an insulative collar member mounted thereon in surrounding relationship relative to said semiconductor chip as received on and affixed to said chip carrier, said chip carrier being disposed on and affixed to said package at a position between said input and output terminals thereof;
    an input matching circuit, provided in said package and operatively connected between said input terminal thereof and said input side of said semiconductor chip, for carrying out impedance matching at said input side of said amplifier circuit;
    an output matching circuit, provided in said package and operatively connected between said output side of said semiconductor chip and said output terminal of said package, for carrying out impedance matching at said output side of said amplifier circuit; and
    said chip carrier being provided between said input matching circuit and said output matching circuit in said package.

15. A microwave semiconductor device as claimed in claim 14, further comprising a first plurality of bonding wires interconnecting said input matching circuit and said input side of said semiconductor chip, and a second plurality of bonding wires interconnecting said output side of said semiconductor chip and said output matching circuit.

16. A microwave semiconductor device as claimed in claim 14, wherein said microwave semiconductor device further comprises:
    an input transmission line, inserted and connected between said input terminal and said input matching circuit, for carrying out a fine control of the impedance matching at the input side of said amplifier circuit; and
    an output transmission line, inserted between said output matching circuit and said output terminal, for carrying out a fine control of the impedance matching at the output side of said amplifier circuit.

17. A microwave semiconductor device as claimed in claim 16, further comprising a first plurality of bonding wires interconnecting said input transmission line and said input matching circuit, and a second plurality of bonding wires interconnecting said output side of said output matching circuit and said output transmission line.

18. A microwave semiconductor device as claimed in claim 14, wherein said microwave semiconductor device comprises a plurality of groups, each group comprising a corresponding said chip carrier having a respective said semiconductor chip fixed thereon, a respective said input matching circuit, and a respective said output matching circuit.

19. A microwave semiconductor device as claimed in claim 14, wherein said chip carrier comprises:

a conductive holder having a main surface including a mounting surface portion on which said semiconductor chip is mounted and a peripheral surface portion surrounding the mounting surface portion; and said insulative collar member is disposed on and affixed to the peripheral surface portion and has inner wall surfaces, transverse to the main surface and surrounding the mounting surface portion of the conductive holder, the inner wall surface of the insulative collar member and the mounting surface portion of the main surface defining a recess, of a depth measured from the mounting surface portion of the main surface and of a lateral configuration and size, for receiving therein and thereby positioning said semiconductor chip on said conductive holder.

20. A microwave semiconductor device as claimed in claim 19, wherein said semiconductor chip has a bottom surface specified at a ground potential level for operation of said semiconductor chip, said bottom surface of said chip being affixed to and electrically connected to said mounting surface portion of said conducting holder and said conductive holder being used to bring out said ground potential level of said bottom surface of said semiconductor chip for external electrical connection.

21. A microwave semiconductor device as claimed in claim 19, wherein said conductive holder is made of gold-plated copper, and said insulative collar member is made of ceramic.

22. A microwave semiconductor device as claimed in claim 19, wherein said chip mounting portion has lateral edges bordered by the inner wall surfaces of said insulative collar member.

23. A microwave semiconductor device as claimed in claim 22, further comprising a solder layer on said chip mounting surface portion and bonded to the bottom surface of said semiconductor chip received in said recess, thereby to fix said semiconductor chip thereon.

24. A microwave semiconductor device as claimed in claim 23, wherein said solder layer is made of a gold-tin alloy.

25. A microwave semiconductor device as claimed in claim 19, wherein a space between the lateral periphery of said semiconductor chip and the corresponding inner wall surfaces of said insulative collar member is less than 100 μm.

26. A microwave semiconductor device as claimed in claim 25, wherein a space between the lateral periphery of said semiconductor chip and the corresponding inner wall surfaces of said insulative collar member is less than 50 μm.

27. A microwave semiconductor device as claimed in claim 19, wherein said semiconductor chip is made of a compound semiconductor material.

28. A microwave semiconductor device as claimed in claim 27, wherein said semiconductor chip is made of Gallium Arsenide.

29. A microwave semiconductor device as claimed in claim 19, wherein the bottom surface of said semiconductor ship is plated with gold.

30. A microwave semiconductor device as claimed in claim 19, wherein said semiconductor chip comprises a plurality of field effect transistors connected so as to constitute an amplifier circuit.

31. A microwave semiconductor device as claimed in claim 19, wherein said semiconductor chip is a monolithic microwave integrated circuit chip.

32. A chip carrier for a semiconductor chip, the chip having upper and lower main surfaces defining a specified thickness of the chip therebetween and a specified lateral configuration and size, comprising:

a conductive holder having a main surface including a chip mounting surface portion, of substantially the same said lateral configuration and size of the chip, for mounting the semiconductor chip thereon, a peripheral surface portion surrounding the mounting surface portion, and outer wall surfaces substantially transverse to the mounting and peripheral surfaces thereof; and an insulative collar member having upper and lower surfaces and inner and outer wall surfaces transverse to the upper and lower surfaces, the lower surface being disposed on and affixed to the peripheral surface portion of the holder, the outer wall surfaces corresponding to and being substantially aligned with the corresponding outer wall surfaces of the holder, and the inner wall surfaces surrounding the mounting surface portion and defining therewithin a recess of a depth, measured from the mounting surface portion of the main surface of the holder, and of a lateral configuration and size, for substantially receiving therein and thereby positioning said semiconductor chip on said mounting surface portion or said conductive holder and with the lower surface of the chip below the upper surface of the insulative collar member and with the upper surface of the chip no lower than the upper surface of the insulative collar member.

33. A chip carrier as claimed in claim 32, wherein the peripheral surface portion of the conductive holder is disposed at a lower level than the level of the mounting .surface portion of the holder.

\* \* \* \* \*

UNITED STATES PATENT AND TRADEMARK OFFICE
CERTIFICATE OF CORRECTION

PATENT NO. : 5,477,083
DATED : Dec. 19, 1995
INVENTOR(S) : KAWAI

It is certified that error appears in the above-indentified patent and that said Letters Patent is hereby corrected as shown below:

Col. 1, line 6, change "INVITATION" to --INVENTION--.

Col. 2, line 7, after "creeping up" insert --of--.

Col. 3, line 44, after "temperature" change "," to --.--;
line 51, after "oxide" change "," to --.--;
line 53, after "portions" change "," to --.--;
line 64, change "are;" to --art;--;
line 65, after "2B" insert --are--.

Col. 4, line 14, change "and" to --to--;
line 64, change "circuit," to --circuit;--.

Col. 6, line 43, after "along a" insert --line--;
line 51, delete "affixing"; and change "thereon" to --is affixed--.

Col. 8, line 52, change "surface" to --portion--.

Col. 11, line 52, change "layer" to --portion--;
line 67, change "1'" to --1''--.

Signed and Sealed this

Eleventh Day of June, 1996

Attest:

BRUCE LEHMAN

Attesting Officer    Commissioner of Patents and Trademarks